(12) United States Patent
White

(10) Patent No.: US 10,368,459 B2
(45) Date of Patent: Jul. 30, 2019

(54) EQUIPMENT CLAMPING ASSEMBLY USING CLAMPS AND FRICTION TO SECURE EQUIPMENT FOR USE IN RUGGED AND OTHER ENVIRONMENTS

(71) Applicant: Raytheon Company, Waltham, MA (US)

(72) Inventor: Brian M. White, Bristol, RI (US)

(73) Assignee: Raytheon Company, Waltham, MA (US)

( * ) Notice: Subject to any disclaimer, the term of this patent is extended or adjusted under 35 U.S.C. 154(b) by 62 days.

(21) Appl. No.: 15/380,972

(22) Filed: Dec. 15, 2016

(65) Prior Publication Data

US 2018/0177066 A1 Jun. 21, 2018

(51) Int. Cl.
| H05K 7/14 | (2006.01) |
| H05K 7/18 | (2006.01) |
| H05K 7/12 | (2006.01) |

(52) U.S. Cl.
CPC .................. H05K 7/1489 (2013.01)

(58) Field of Classification Search
CPC ...... H05K 7/1488; H05K 7/14; H05K 5/0208; H05K 5/0204; H05K 5/0217; H05K 7/18; G06F 1/181
See application file for complete search history.

(56) References Cited

U.S. PATENT DOCUMENTS

| 2,944,864 | A |  | 7/1960 | Krivulka |  |
| 5,211,459 | A | * | 5/1993 | Wu | G06F 1/184 |
|  |  |  |  |  | 211/26 |
| 5,654,874 | A | * | 8/1997 | Suzuki | G06F 1/184 |
|  |  |  |  |  | 361/679.31 |
| 5,668,696 | A |  | 9/1997 | Schmitt |  |
| 6,097,604 | A |  | 8/2000 | Hunter et al. |  |
| 6,373,707 | B1 | * | 4/2002 | Hutchins | G06F 1/183 |
|  |  |  |  |  | 211/41.17 |
| 6,616,106 | B1 | * | 9/2003 | Dean | G06F 1/184 |
|  |  |  |  |  | 248/27.1 |
| 6,745,603 | B1 | * | 6/2004 | Shaw | E05B 9/08 |
|  |  |  |  |  | 70/277 |
| 7,255,409 | B2 | * | 8/2007 | Hu | A47B 88/43 |
|  |  |  |  |  | 211/26 |
| 7,364,243 | B2 |  | 4/2008 | Wyatt et al. |  |

(Continued)

OTHER PUBLICATIONS

Peter E. Dennison, "Equipment Clamping Assembly Having Horizontal and Vertical Clamps for Use in Rugged and Other Environments," U.S. Appl. No. 15/379,978, filed Dec. 15, 2016, 29 pages.

*Primary Examiner* — James Wu
*Assistant Examiner* — Michael A Matey

(57) ABSTRACT

An apparatus includes a clamping assembly configured to receive and secure a component in a support structure. The clamping assembly includes a faceplate configured to be coupled to the support structure. The clamping assembly also includes first and second side rails configured to be coupled to the support structure and to apply frictional forces to the component. The clamping assembly further includes first and second spring assemblies configured to be coupled to the faceplate. The spring assemblies are also configured to pull clamps mounted to the side rails toward the faceplate in order to apply clamping forces to the component.

21 Claims, 12 Drawing Sheets

(56) References Cited

U.S. PATENT DOCUMENTS

| | | | |
|---|---|---|---|
| 7,382,623 B2* | 6/2008 | Hartman | H05K 7/1421 |
| | | | 211/162 |
| 8,787,023 B2 | 7/2014 | Lewis, II et al. | |
| 9,723,745 B2* | 8/2017 | Qi | H05K 7/1489 |
| 2003/0234602 A1* | 12/2003 | Cutler | A47B 88/43 |
| | | | 312/333 |
| 2004/0169379 A1* | 9/2004 | Hemping | E05B 1/003 |
| | | | 292/336.3 |
| 2005/0156493 A1* | 7/2005 | Yang | H05K 7/1489 |
| | | | 312/334.5 |
| 2005/0285493 A1* | 12/2005 | Hu | H05K 7/1489 |
| | | | 312/334.4 |
| 2008/0067907 A1* | 3/2008 | Chen | A47B 88/43 |
| | | | 312/312 |
| 2009/0114785 A1* | 5/2009 | Huang | H05K 7/1489 |
| | | | 248/220.31 |
| 2009/0166485 A1* | 7/2009 | Chen | A47B 88/43 |
| | | | 248/200 |
| 2009/0167127 A1* | 7/2009 | Chen | A47B 88/43 |
| | | | 312/334.1 |
| 2013/0182381 A1* | 7/2013 | Gray | F16M 13/02 |
| | | | 361/679.01 |
| 2015/0137536 A1* | 5/2015 | Kondratuk | E05B 15/02 |
| | | | 292/336.3 |
| 2016/0002954 A1* | 1/2016 | Ali | E05B 63/18 |
| | | | 292/336.3 |
| 2016/0105989 A1* | 4/2016 | Henderson | G06F 1/181 |
| | | | 361/679.31 |
| 2016/0295728 A1* | 10/2016 | Alvarado | H05K 5/03 |

* cited by examiner

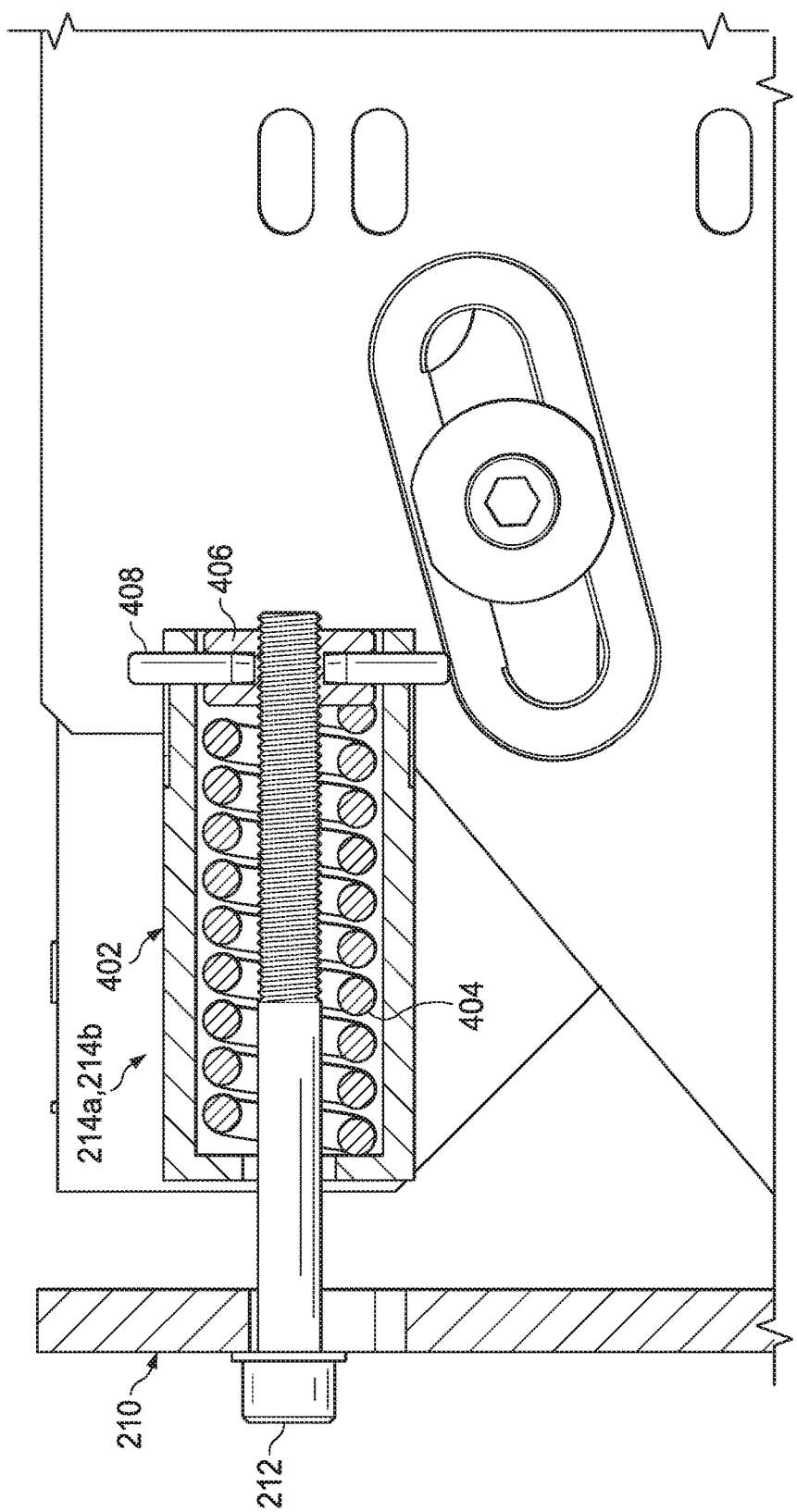

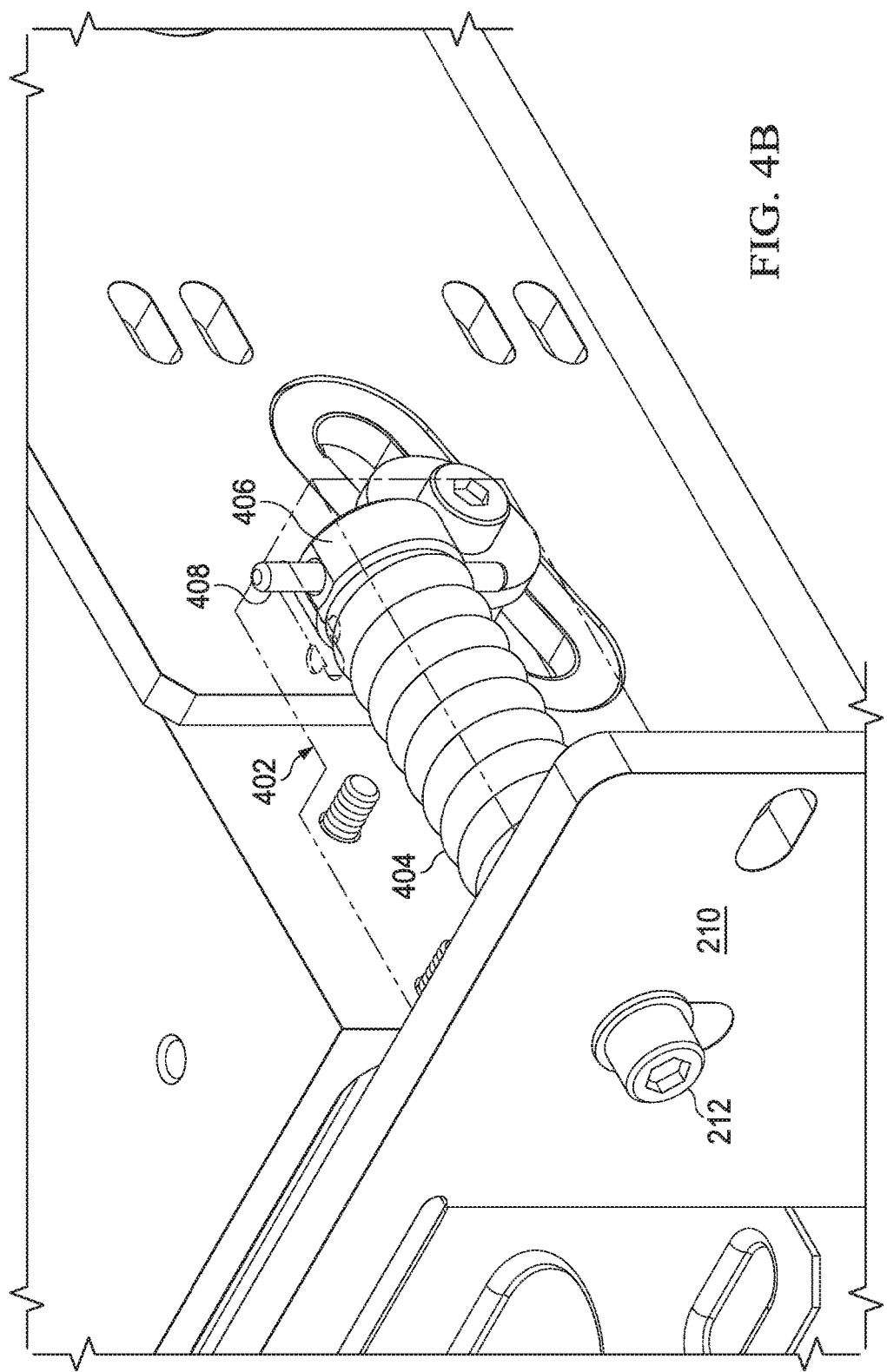

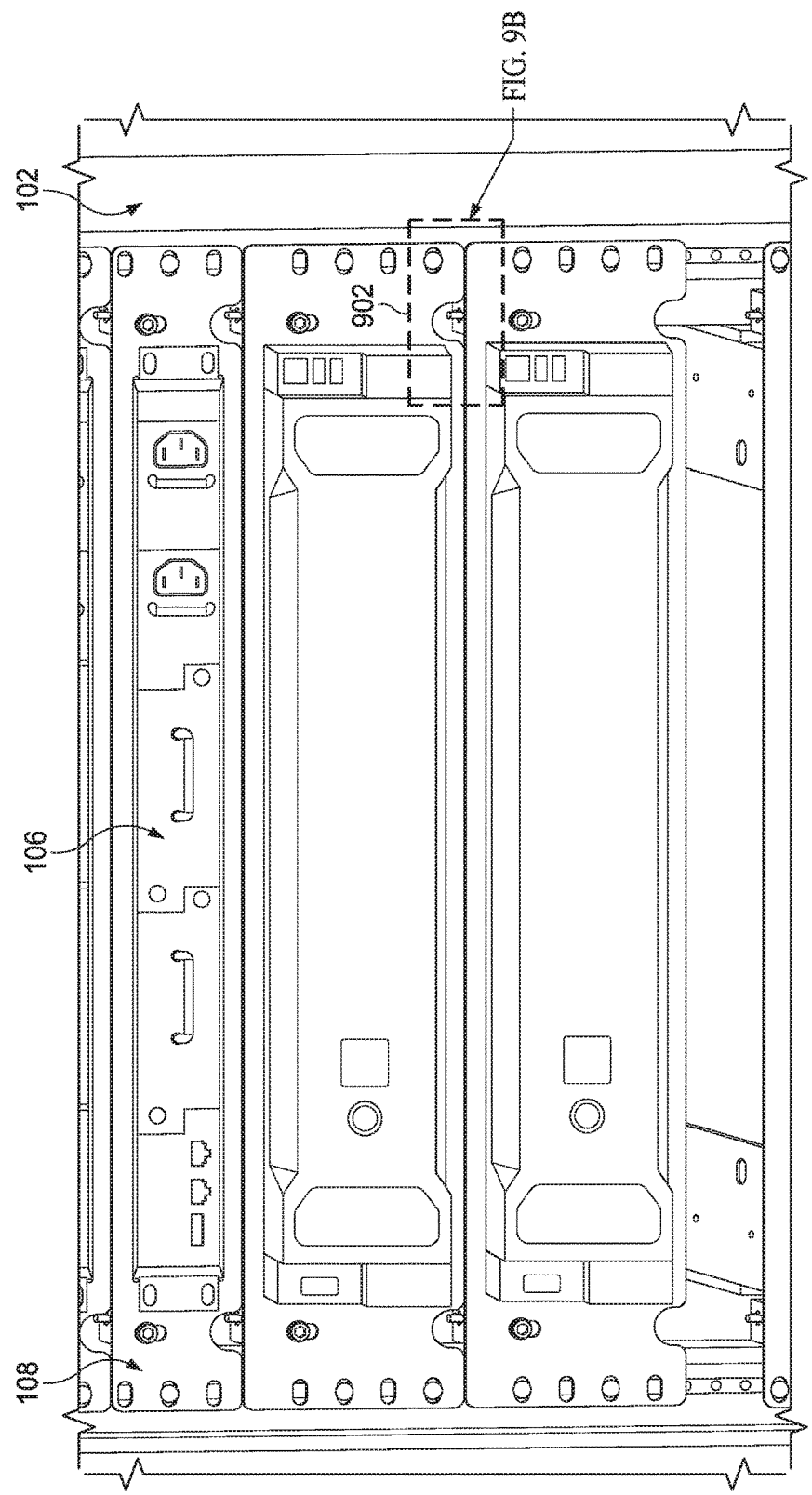

EQUIPMENT CLAMPING ASSEMBLY USING CLAMPS AND FRICTION TO SECURE EQUIPMENT FOR USE IN RUGGED AND OTHER ENVIRONMENTS

TECHNICAL FIELD

This disclosure generally relates to mounting assemblies for physically mounting equipment in cabinets or to other support structures. More specifically, this disclosure relates to an equipment clamping assembly using clamps and friction to secure equipment for use in rugged and other environments.

BACKGROUND

Electronic equipment is routinely used in an operational environment by mounting the equipment in one or more cabinets. It is becoming more and more common to use commercial off-the-shelf (COTS) electronic equipment whenever possible since COTS equipment is typically less expensive and more readily available than specialized equipment. However, in rugged environments such as various commercial or military applications, electronic equipment could be subjected to severe shocks or vibrations. Unfortunately, standard COTS equipment is usually not designed to operate in rugged environments where severe shocks or vibrations are present. If not mitigated, these shocks or vibrations could damage or destroy the electronic equipment or even cause the electronic equipment to be forcibly ejected from a cabinet.

SUMMARY

This disclosure provides an equipment clamping assembly using clamps and friction to secure equipment for use in rugged and other environments.

In a first embodiment, an apparatus includes a clamping assembly configured to receive and secure a component in or to a support structure. The clamping assembly includes a faceplate configured to be coupled to the support structure. The clamping assembly also includes first and second side rails configured to be coupled to the support structure and to apply frictional forces to the component. The clamping assembly further includes first and second spring assemblies configured to be coupled to the faceplate. The spring assemblies are also configured to pull clamps mounted to the side rails toward the faceplate in order to apply clamping forces to the component.

In a second embodiment, a system includes a cabinet configured to receive and hold multiple pieces of electronic equipment. The system also includes at least one clamping assembly configured to be coupled to the cabinet. Each clamping assembly is configured to receive and secure at least one of the pieces of electronic equipment. Each clamping assembly includes a faceplate configured to be coupled to the cabinet. Each clamping assembly also includes first and second side rails configured to be coupled to the cabinet and to apply frictional forces to the at least one piece of electronic equipment. Each clamping assembly further includes first and second spring assemblies configured to be coupled to the faceplate and to pull clamps mounted to the side rails toward the faceplate in order to apply clamping forces to the at least one piece of electronic equipment.

In a third embodiment, a method includes coupling a faceplate and first and second side rails of a clamping assembly to a support structure. The method also includes coupling fasteners through the faceplate to first and second spring assemblies of the clamping assembly. The method further includes using the spring assemblies to pull clamps mounted to the side rails toward the faceplate in order to apply clamping forces to a component mounted in the support structure. In addition, the method includes using high-friction surfaces of the side rails to create frictional forces that contain the component during a shock or vibration event.

Other technical features may be readily apparent to one skilled in the art from the following figures, descriptions, and claims.

BRIEF DESCRIPTION OF THE DRAWINGS

For a more complete understanding of this disclosure, reference is made to the following description, taken in conjunction with the accompanying drawings, in which:

FIGS. 4A and 4B illustrate an example spring assembly used in the clamping assembly according to this disclosure;

FIGS. 9A through 9C illustrate an example inspection mechanism for use with the clamping assembly according to this disclosure.

DETAILED DESCRIPTION

FIGS. 1 through 10, described below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

Figure 1:
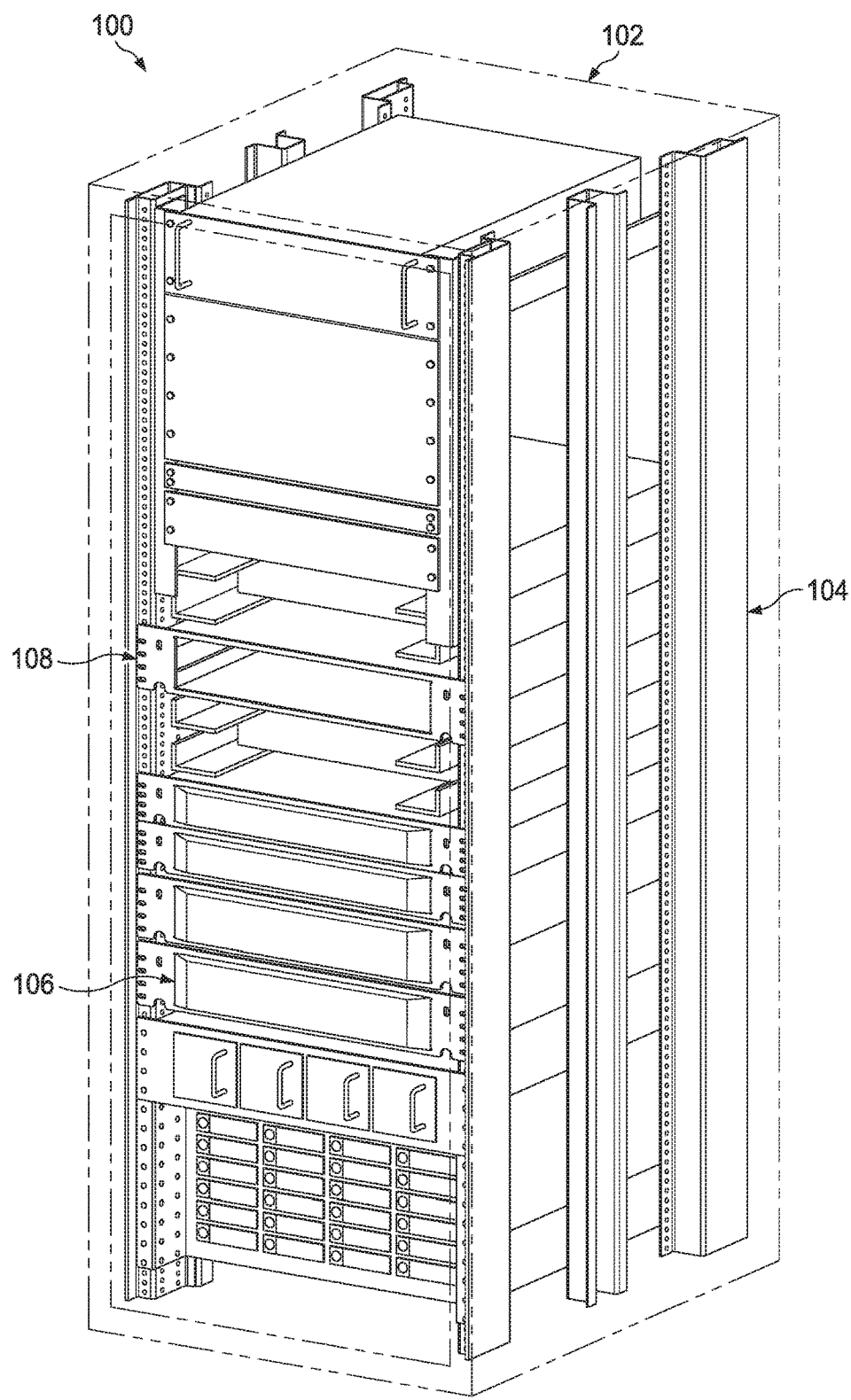
FIG. 1 illustrates an example system for mounting electronic equipment according to this disclosure.

FIG. 1 illustrates an example system 100 for mounting electronic equipment according to this disclosure. As shown in FIG. 1, the system 100 includes a cabinet 102. For ease of illustration and explanation, the outer panels or "skin" and optionally one or more doors of the cabinet 102 have been removed so that an interior of the cabinet 102 is visible in FIG. 1.

The cabinet 102 here includes a number of vertical rails 104, each of which includes a number of holes formed by machining or other suitable technique. The holes of the rails 104 are used to receive bolts or other connectors in order to attach equipment to the cabinet 102. The holes of the rails 104 typically have a specified size and are typically formed at a specified interval up and down along the rails 104. In some embodiments, the cabinet 102 is designed to receive equipment that complies with a standard specification, such as equipment that complies with the Electronic Industries Association (EIA) RS-310 specification. This specification or other specifications can define the standard size and spacing for the holes in the rails 104. While the cabinet 102 itself could be wider than a standard RS-310 cabinet, the cabinet 102 can be configured to receive equipment that is compliant with the RS-310 specification.

Multiple pieces of electronic equipment 106 can be installed in the cabinet 102. The electronic equipment 106 could denote any suitable equipment and can perform a wide variety of functions depending on the implementation. For example, some of the electronic equipment 106 could denote server computers or other computing devices that are programmed to process data or control various aspects of a vessel or other structure. Other electronic equipment 106 could include power supplies, power conditioners, and communications equipment. Each piece of electronic equipment 106 includes any suitable electronic circuitry and is configured to be mounted in a cabinet. In some embodiments, at least one piece of electronic equipment 106 could denote commercial off-the-shelf (COTS) equipment, although this need not be the case.

One or more clamping assemblies 108 are used to mount at least one piece of electronic equipment 106 in the cabinet 102. As described in more detail below, the clamping assemblies 108 can be used to hold electronic equipment in a cabinet 102 and are able to withstand large shock and vibration loads, which can occur in various rugged environments.

One problem in rugged military, commercial, or other environments is that electronic equipment 106 in a cabinet 102 can be subjected to severe shocks or vibrations. Without some form of mitigation, the shocks or vibrations can damage or destroy the electronic equipment 106. In some instances, the shocks or vibrations could even cause a piece of electronic equipment 106 to be forcibly ejected from a cabinet 102. Not only could this cause secondary damage to nearby equipment or structures, it could cause severe injury or death to nearby personnel.

The clamping assemblies 108 described in this patent document can help to secure electronic equipment 106 in one or more cabinets 102 in order to provide additional support to and protection for the electronic equipment 106. In some instances, a clamping assembly 108 is used with COTS equipment 106 so that the COTS equipment 106 can be used in military, severe commercial, or other environments where the COTS equipment 106 by itself traditionally could not be used. In particular embodiments, a clamping assembly 108 allows electronic equipment 106 to be used in severe shock and vibration environments as defined by the MIL-STD-810 standard.

Moreover, the clamping assemblies 108 allow for easy installation, removal, and replacement of the electronic equipment 106. In some instances, personnel can easily install and remove the electronic equipment 106 from the clamping assemblies 108 without much effort. For example, the electronic equipment 106 could be inserted into or removed from the cabinet 102 through the front or the back of a clamping assembly 108. This helps to increase the ease of use and maintenance of the electronic equipment 106 and the overall system 100.

In addition, the height of cabinet-mounted electronic equipment 106 is often measured in terms of a standard "rack unit" (RU), such as 1 RU, 2, RU, and so one. A clamping assembly 108 could be designed to receive electronic equipment of a particular height, and different clamping assemblies 108 could be designed to receive electronic equipment of different heights. As a result, the clamping assemblies 108 can be easily designed or modified for use with any suitable equipment.

Additional details regarding various clamping assemblies 108 are provided below. While those details may be provided with respect to use of the clamping assemblies 108 in the cabinet 102 of FIG. 1, the clamping assemblies 108 described in this patent document could be used in any suitable systems and with any suitable components to be secured to any suitable support structures.

Although FIG. 1 illustrates one example of a system 100 for mounting electronic equipment, various changes may be made to FIG. 1. For example, a system could include any number of cabinets 102, and each cabinet 102 could include any number of rails 104 or other structural components. Also, each cabinet 102 could be used to hold any number of pieces of electronic equipment 106. Further, one, some, or all of the pieces of electronic equipment 106 could use one or more clamping assemblies 108 when secured in at least one cabinet 102. In addition, while FIG. 1 illustrates one example system where one or more clamping assemblies 108 could be used, the clamping assemblies 108 described in this patent document could be used in any other suitable system.

Figure 2:
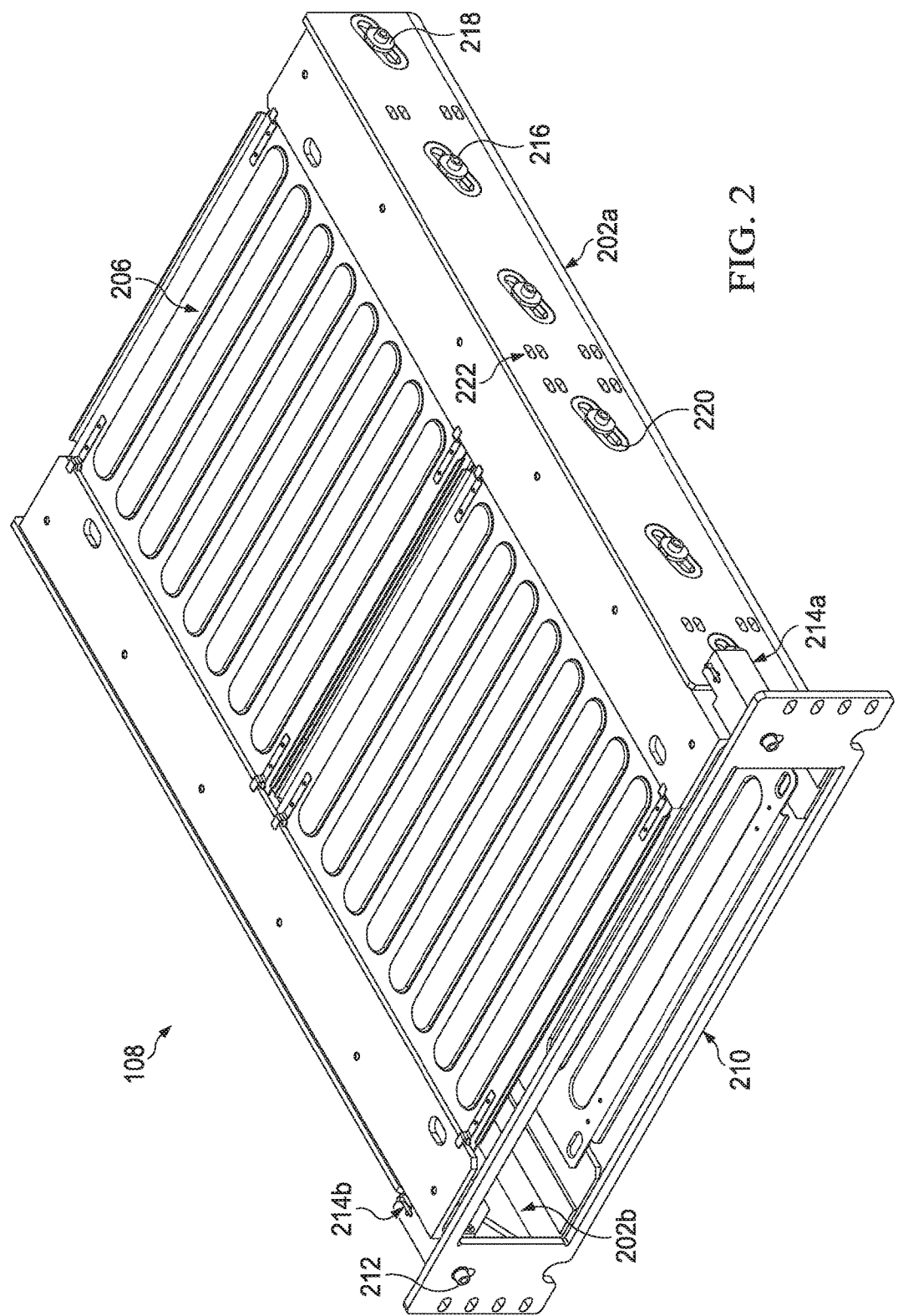
FIGS. 2 and 3 illustrate an example clamping assembly for use with electronic equipment according to this disclosure.
Figure 3:
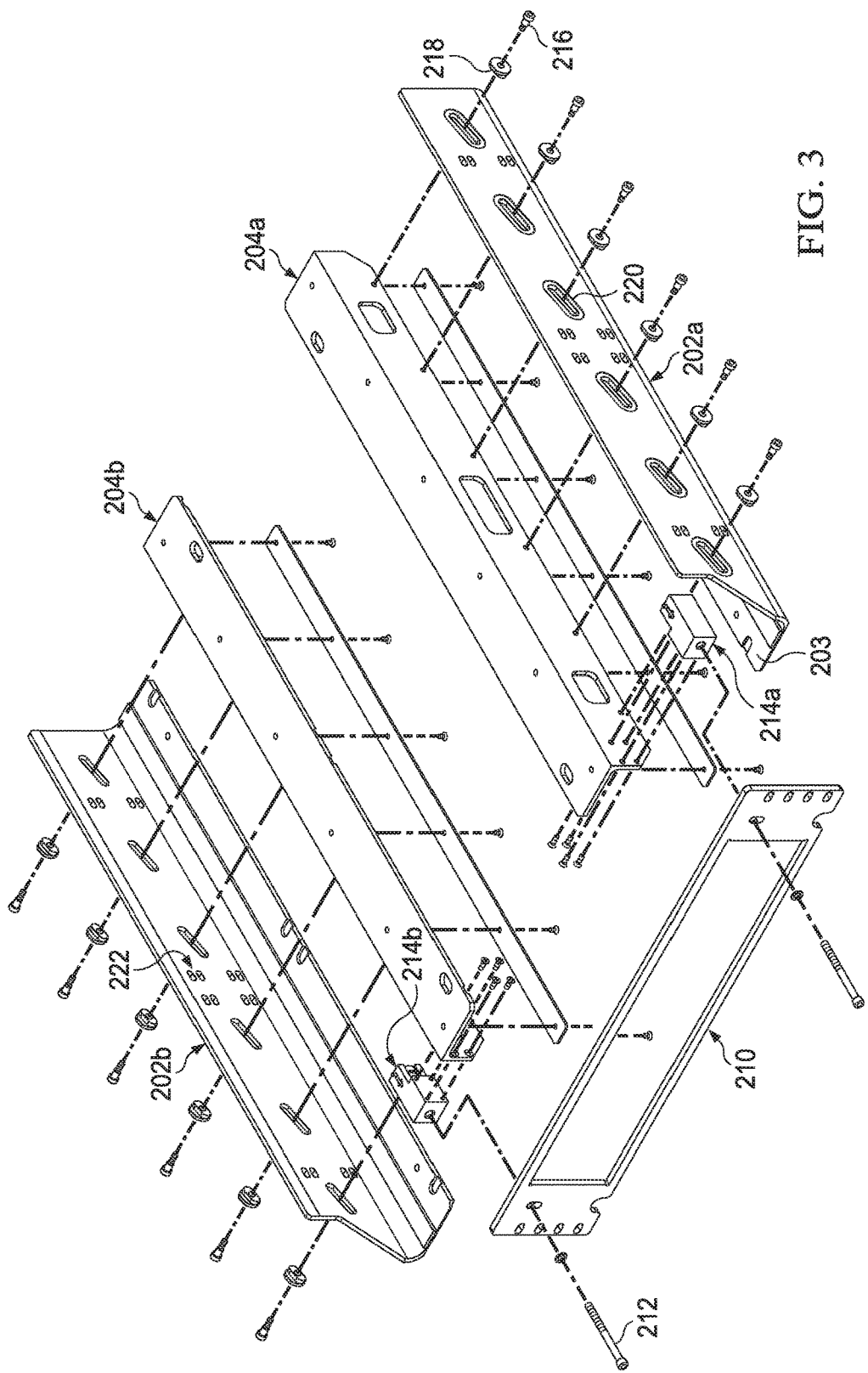

FIGS. 2 and 3 illustrate an example clamping assembly 108 for use with electronic equipment according to this disclosure. As shown in FIGS. 2 and 3, the clamping assembly 108 includes two side rails 202a-202b. The side rails 202a-202b extend along most or all of the length of the clamping assembly 108 and are coupled to a cabinet 102 or other support structure (such as along opposite sides of the cabinet 102). The side rails 202a-202b include a number of holes 222, which can align with holes in various rails 104 or flanges of the rails 104 in the cabinet 102. Bolts or other connectors could be inserted through the holes of the rails 104 and through the holes 222 of the side rails 202a-202b to couple the side rails 202a-202b to the rails 104 of the cabinet 102.

Each side rail 202a-202b includes a flange 203 that projects inward towards the other side rail 202a-202b. The side rails 202a-202b also contain or are coupled to clamps 204a-204b, respectively. As described in more detail below, the clamps 204a-204b apply clamping forces on a piece of electronic equipment 106 that is inserted between the side rails 202a-202b.

Each of the side rails 202a-202b could be formed from any suitable material(s) and in any suitable manner. For example, each of the side rails 202a-202b could be formed using steel or other metal. Also, various features could be formed in the metal using bending, stamping, machining, or other metal-working operations. In addition, other sizes or shapes of the flanges 203 could be used here.

The clamping assembly 108 may also include one or more optional plates 206, which can be installed on top or on bottom of the clamping assembly 108. The plates 206 provide structural reinforcement for a piece of electronic equipment 106 inserted into the clamping assembly 108. The plates 206 could be formed from any suitable material(s) and in any suitable manner. For example, each of the plates 206 could be formed using steel or other metal, and various features could be formed in the metal using bending, stamping, machining, or other metal-working operations. In some embodiments, the plates 206 are removable and can be easily added to or removed from the clamping assembly 108 as needed or desired. For instance, the plates 206 may not be needed if a piece of electronic equipment 106 has adequate support built into the equipment 106.

A faceplate 210 can be secured to various rails 104 of the cabinet 102 or to another support structure, such as by using bolts or other connectors. Also, fasteners 212 can be inserted through the faceplate 210 and connected to spring assemblies 214a-214b, which are connected to the clamps 204a-204b, respectively. As described in more detail below, the spring assemblies 214a-214b receive the fasteners 212 and use the fasteners 212 to pull the clamps 204a-204b toward the faceplate 210, thereby causing the clamps 204a-204b to apply clamping forces on the electronic equipment 106. The faceplate 210 could be formed from any suitable material(s) and in any suitable manner. For example, the faceplate 210 could be formed using steel or other metal, and various features could be formed in the metal using stamping, machining, or other metal-working operations.

The clamps 204a-204b here are movable along the length of the side rails 202a-202b using shoulder bolts 216, low-friction bearings 218, and cam slots 220 in the side rails 202a-202b. To couple the clamps 204a-204b to the side rails 202a-202b, the shoulder bolts 216 are inserted through the bearings 218, and the shoulder bolts 216 and the bearings 218 are inserted into the cam slots 220 of the side rails 202a-202b. The shoulder bolts 216 are secured to the clamps 204a-204b, such as by screwing threaded ends of the shoulder bolts 216 into threaded areas of the clamps 204a-204b. During use, portions of the shoulder bolts 216 and bearings 218 are maintained within the cam slots 220 of the side rails 202a-202b, which helps to confine the clamps 204a-204b to moving back and forth along the cam slots 220.

The spring assemblies 214a-214b operate to pull the clamps 204a-204b toward the faceplate 210, causing the shoulder bolts 216 and the bearings 218 to move within the cam slots 220. The cam slots 220 are angled downward as the cam slots 220 extend toward the end of the clamping assembly 108 with the faceplate 210. Thus, movement of each clamp 204a-204b towards that end of the clamping assembly 108 causes the clamp 204a-204b to physically move downward towards the electronic equipment 106. Various angles that are not parallel or perpendicular to the long axis of the side rail 202a or 202b could be used with the cam slots 220. In some embodiments, the cam slots 220 are angled between 16° and 18° with respect to the long axis of the side rail 202a or 202b, although other angles could be used.

Each shoulder bolt 216 denotes any suitable structure that can be connected to a clamp and have a portion that remains within a cam slot. Each bearing 218 includes any suitable movable or rotatable structure having a low friction, such as a TEFLON-coated bearing or other coated bearing. Each cam slot 220 denotes an opening having any suitable oval, elliptical, or other elongated form.

Additional details regarding specific features of the clamping assembly 108 are described below with respect to FIGS. 4A through 9C. Note that these details relate to specific implementations of the clamping assembly 108 and that other embodiments of the clamping assembly 108 could use other or additional components.

Although FIGS. 2 and 3 illustrate one example of a clamping assembly 108 for use with electronic equipment 106, various changes may be made to FIGS. 2 and 3. For example, the sizes, shapes, and relative dimensions of the various components in the clamping assembly 108 are for illustration only and can be modified as needed or desired. As noted above, for instance, different clamping assemblies 108 could be designed to secure equipment 106 of different heights. Also, the cam slots and the pins could be reversed such that a structure having a pin could include a cam slot and a structure having a cam slot could include a pin. In addition, various directional terms (such as top, bottom, and side) are used above for convenience only and are made with reference to the particular orientation shown in FIGS. 2 and 3. However, this does not limit how the clamping assembly 108 can be used, and the clamping assembly 108 could be used in any suitable orientations.

FIGS. 4A and 4B illustrate an example spring assembly 214a-214b used in the clamping assembly 108 according to this disclosure. As noted above, the spring assemblies 214a-214b receive the bolts or other fasteners 212 that are inserted through holes of the faceplate 210. In this example, each spring assembly 214a-214b includes a housing 402 with an opening that receives part of one of the fasteners 212. The housing 402 also contains a spring 404. One of the fasteners 212 can be inserted through the spring 404 and attached to a spring nut 406 located at the far end of the spring 404. One or more pins 408 can be inserted into the spring nut 406 to help contain the spring 404 and prevent the spring nut 406 from rotating. As described below, the top pin 408 could extend outside the housing 402 and provide a visual indication of the loading on the spring 404 in the spring assembly 214a-214b.

The housing 402 includes any suitable structure configured to encase, protect, or otherwise hold other components of a spring assembly. The spring 404 includes any suitable structure providing a spring-like force. The spring nut 406 includes any suitable structure configured to receive and retain a bolt or other fastener inserted into a spring assembly. Each pin 408 includes any suitable structure configured to be inserted into a spring nut.

A clamping assembly 108 can be assembled by coupling the side rails 202a-202b and the faceplate 210 to rails 104 of a cabinet 102. The clamps 204a-204b can be mounted on the side rails 202a-202b before, during, or after the side rails 202a-202b are coupled to the cabinet 102. The fasteners 212 are inserted through holes of the faceplate 210 and into the spring assemblies 214a-214b. The fasteners 212 are passed through the springs 404 of the spring assemblies 214a-214b and can be partially secured to the spring nuts 406 of the spring assemblies 214a-214b. Equipment 106 can be inserted into the clamping assembly 108, and the fasteners 212 can be tightened onto the spring nuts 406 to load the springs 404 to a suitable degree. This causes the springs 404 to push against the spring nuts 406. Since the fasteners 212 are secured against the faceplate 210, this pulls the clamps 204a-204b along the cam slots 220 toward the faceplate 210, thus clamping the equipment 106 in the clamping assembly 108.

The clamping forces from the clamps 204a-204b push the equipment 106 into a high-friction material (described below) on the side rails 202a-202b. This creates frictional holding forces that contain the equipment 106 in the clamping assembly 108. As a result, if a shock or vibration creates a load on the electronic equipment 106, the clamping assembly 108 maintains the equipment 106 in a clamped position.

Among other things, the spring assemblies 214a-214b can provide a precise input clamping load for the electronic equipment 106. This can help to reduce or eliminate the risk of excessive clamping forces being applied to the electronic equipment 106. This can also help to create a more compliant clamping range that is achievable using the clamping assembly 108. Because of this, the clamping assembly 108 can maintain a preload on the equipment 106 even if the equipment 106 deforms over some period of time.

Figure 5:
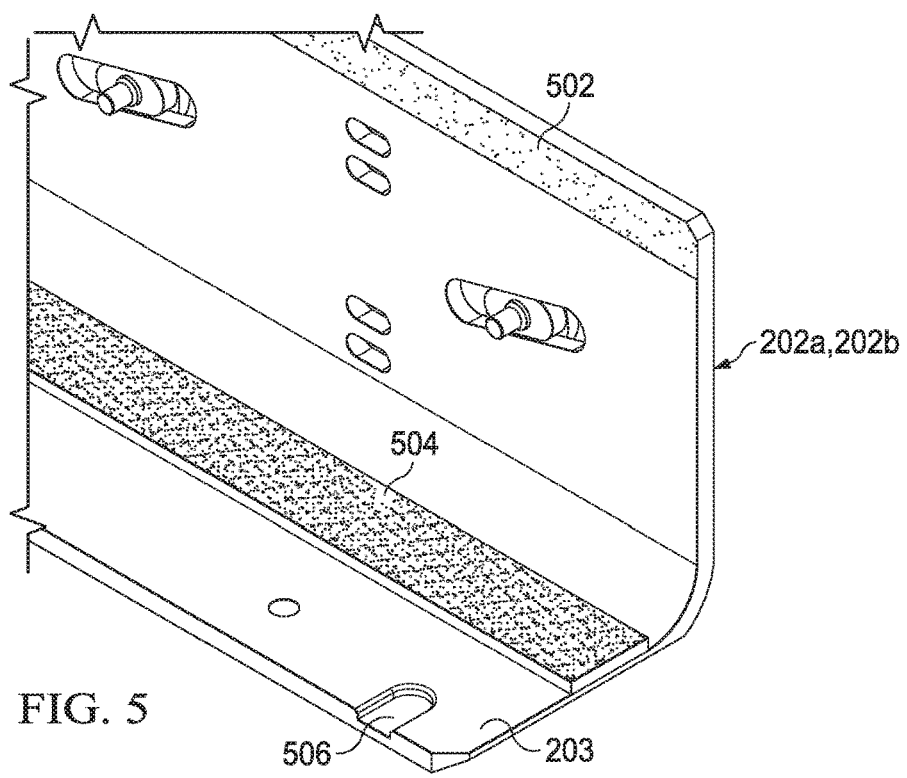
FIGS. 5 through 7 illustrate the use of low-friction and high-friction materials with the clamping assembly according to this disclosure.
Figure 6:
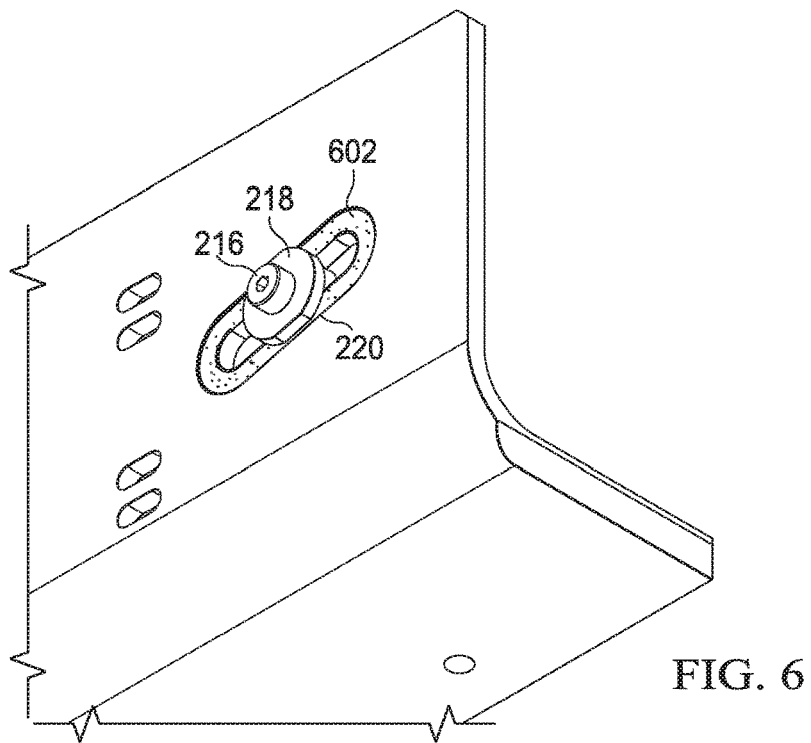
Figure 7:
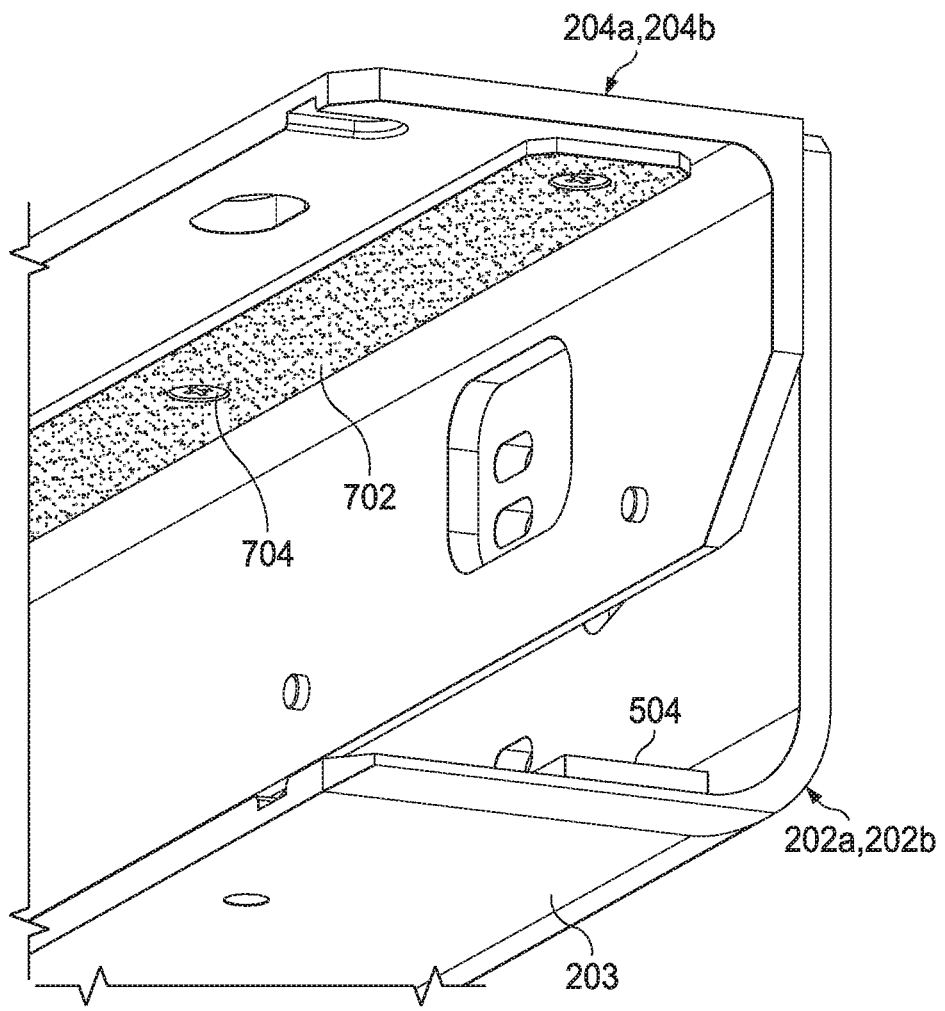

FIGS. 5 through 7 illustrate the use of low-friction and high-friction materials with the clamping assembly 108 according to this disclosure. In particular, FIGS. 5 and 6 illustrate the use of low-friction materials with the clamping assembly 108. As shown in FIG. 5, at least one piece of low-friction material 502 can be placed on an inner vertical surface of each side rail 202a-202b. The low-friction material 502 is located in positions on the side rails 202a-202b so that the low-friction material 502 sits between the side rails 202a-202b and the clamps 204a-204b during use. The low-friction material 502 therefore helps to facilitate sliding of the clamps 204a-204b against the side rails 202a-202b. Of course, the low-friction material 502 could also or alternatively be placed on the clamps 204a-204b.

As shown in FIG. 6, each of the cam slots 220 can include at least one piece of low-friction material 602. The low-friction bearings 218 and the low-friction material 602 help to facilitate sliding of the shoulder bolts 216 within the cam slots 220.

As can be seen here, the low-friction materials 502 and 602 are used at various contact surfaces of the clamping assembly 108. Among other things, the low-friction materials 502 and 602 can be used to reduce clamping losses and achieve more predictable clamping forces in the clamping assembly 108. Each of the low-friction materials 502 and 602 includes any suitable material(s) having a low coefficient of friction that facilitates easier sliding or other moving of components, such as TEFLON tape.

FIGS. 5 and 7 illustrate the use of high-friction material with the clamping assembly 108. As shown in FIGS. 5 and 7, at least one piece of high-friction material 504 can be placed on an inner horizontal flange surface of each side rail 202a-202b. The high-friction material 504 could be secured to a side rail 202a-202b in any suitable manner, such as by using an adhesive. The high-friction material 504 includes any suitable material(s) having a high coefficient of friction that facilitates frictional holding of equipment. For example, the high-friction material 504 could represent a rubber strip.

As shown in FIG. 7, at least one piece of material 702 can be placed on an inner horizontal surface of each clamp 204a-204b. The material 702 could be secured to a clamp 204a-204b in any suitable manner, such as by using screws, bolts, or other connectors 704 or an adhesive. The material 702 can be soft or otherwise provide a cushion between the equipment 106 being clamped and the clamps 204a-204b while allowing the clamps 204a-204b to apply clamping forces on the equipment 106. This can help to avoid damaging the equipment 106 during use within the clamping assembly 108. The material 702 has a coefficient of friction lower than the high-friction material 504 so that, when the clamps 204a-204b are pushed onto the equipment 106, the equipment 106 does not slide and maintains its position within the clamping assembly 108. As one example, the material 702 could represent a DELRIN strip.

The high-friction material 504 is used here to create frictional holding forces to contain the electronic equipment 106. In one orientation of the clamping assembly 108, the high-friction material 504 can be used to provide frictional holding forces to contain the electronic equipment 106 in the X-Y (horizontal) direction, while the clamps 204a-204b can be used to provide a clamping force primarily to contain the electronic equipment 106 in the Z (vertical) direction.

In order to increase the frictional hold on the electronic equipment 106, friction tape could be placed on the electronic equipment 106 in one or more locations. For example, friction tape could be placed on the electronic equipment 106 at locations where the friction tape would align with the high-friction material 504. The friction tape conforms to the compliant rubber or other high-friction material 504 to improve the frictional holding forces on the equipment 106.

Figure 8A:
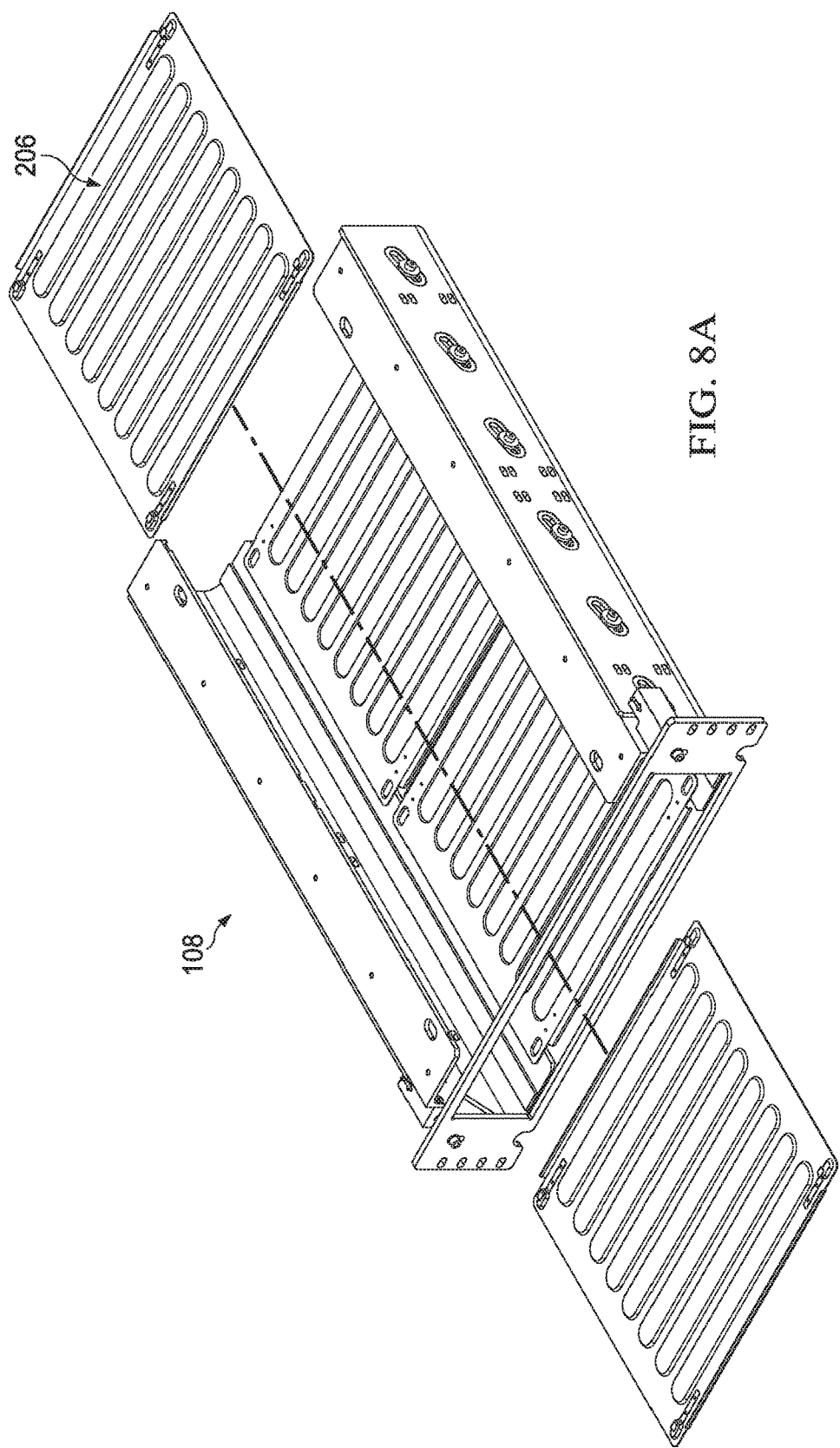
FIGS. 8A through 8C illustrate example removable plates used in the clamping assembly according to this disclosure.
Figure 8B:
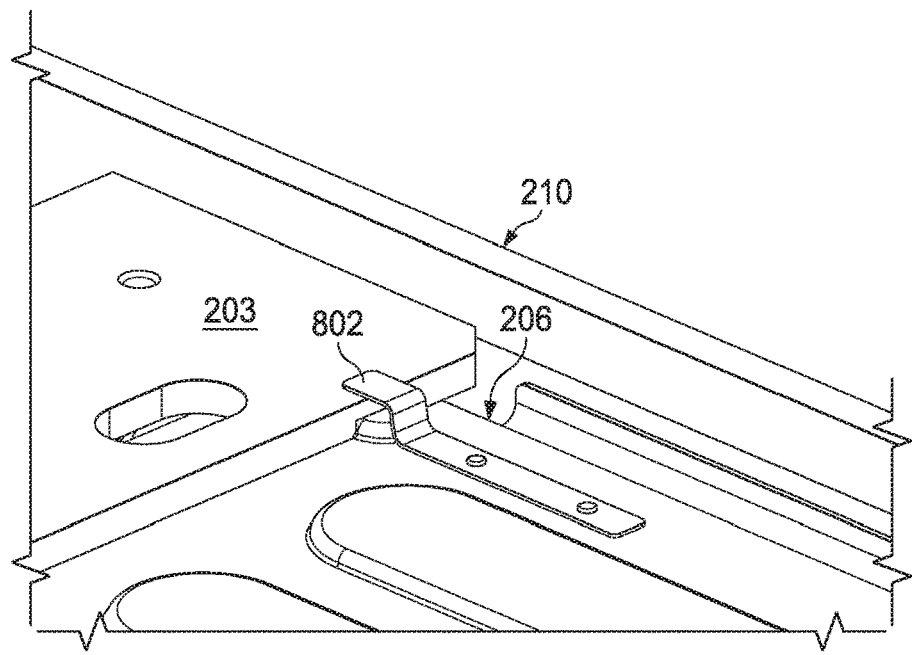
Figure 8C:
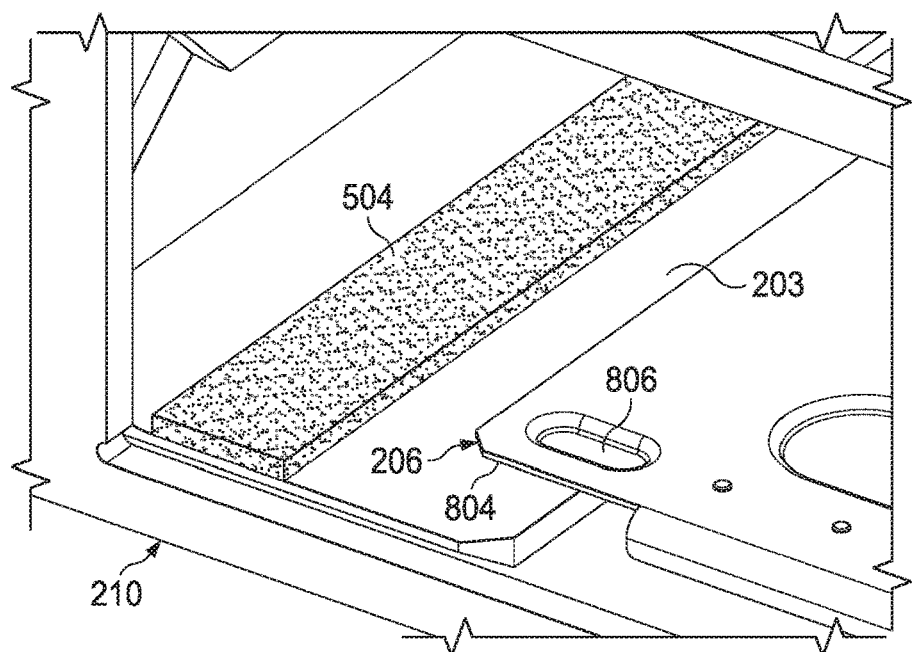

FIGS. 8A through 8C illustrate example removable plates used in the clamping assembly 108 according to this disclosure. In particular, FIGS. 8A through 8C illustrate example removable plates 206 that could optionally be used in the clamping assembly 108.

As shown in FIGS. 8A through 8C, each plate 206 can include multiple spring clips 802 positioned on one side of the plate 206. Each plate 206 can also include extensions 804 on opposite ends of the plate 206. A space between an extension 804 and a spring clip 802 can receive a portion of a flange 203 of a side rail 202a-202b or a portion of a clamp 204a-204b. In this way, the plate 206 can be secured to the side rails 202a-202b or clamps 204a-204b while allowing the plate 206 to be removed later if necessary. Note, however, that any other suitable attachment mechanisms could be used to attach one or more plates in the clamping assembly 108.

As shown in FIG. 8C, corners of the plates 206 could include at least one dipple 806. Each dipple 806 denotes a depression formed in the extension 804 of an associated plate 206. Those depressions could denote the only portions of the extensions 804 that actually contact a flange 203 of a side rail 202a-202b or a clamp 204a-204b. The presence of the dipples 806 on the plate 206 provides some ability for the plate 206 to cavitate within relief cuts 506 (shown in FIG. 5) during use.

Figure 9B:
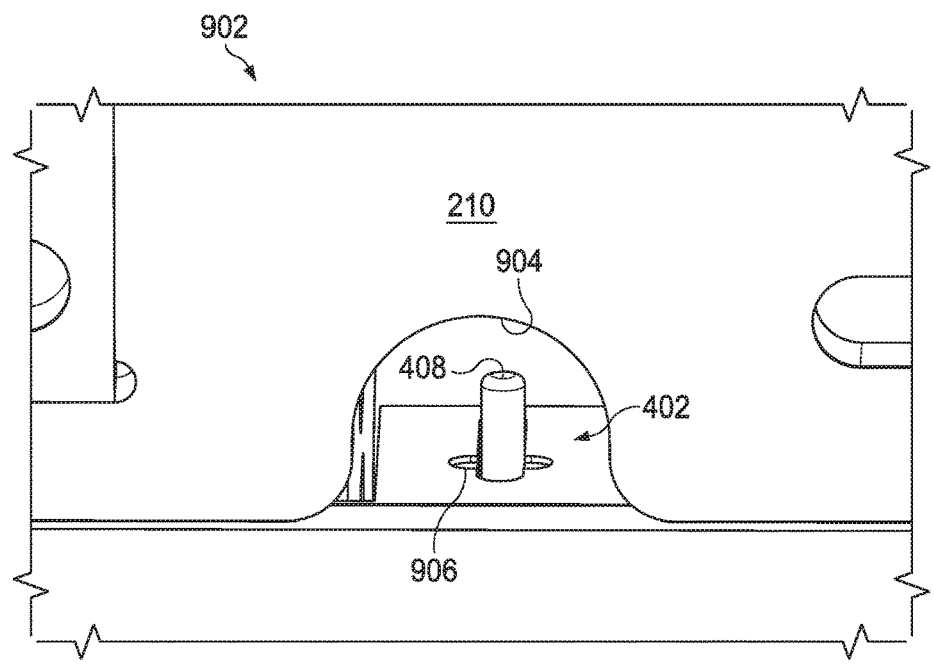
Figure 9C:
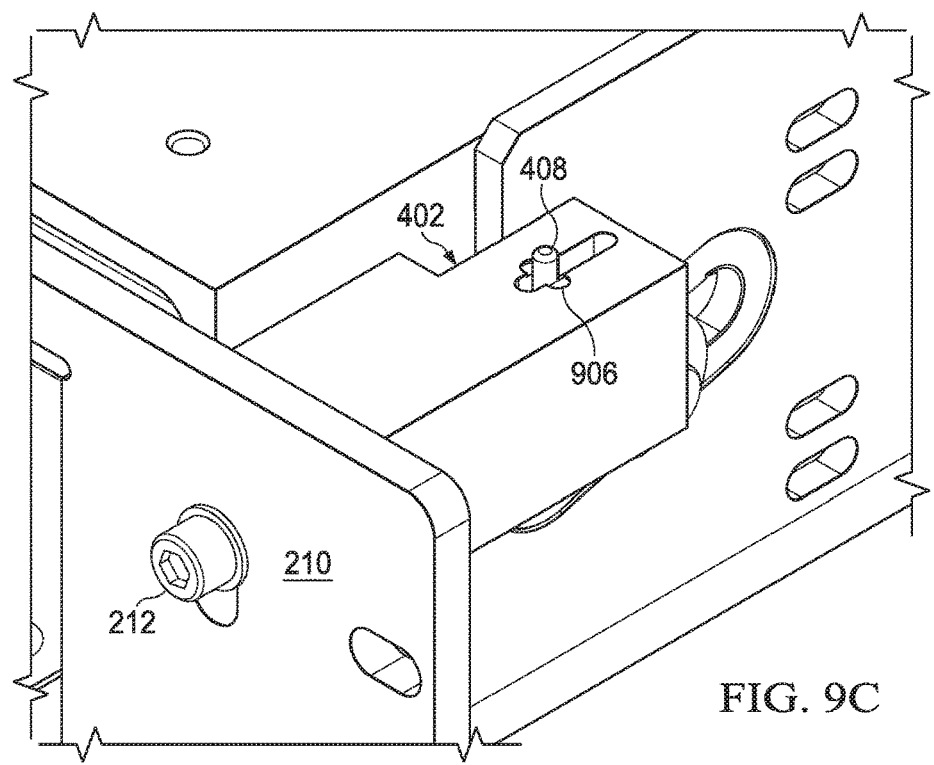

FIGS. 9A through 9C illustrate an example inspection mechanism for use with the clamping assembly 108 according to this disclosure. FIG. 9A illustrates a view of several pieces of electronic equipment 106 inserted into clamping assemblies 108 and mounted on a cabinet 102. Different clamping assemblies 108 here have different heights and are used to mount equipment 106 of different heights to the cabinet 102. For example, as noted above, different clamping assemblies 108 could be used to mount electronic equipment 106 having different "rack unit" heights, such as heights of 1 RU, 2, RU, and so one.

A portion 902 of the view in FIG. 9A is shown in an enlarged fashion in FIG. 9B. As shown in FIGS. 9A and 9B, the faceplate 210 of each clamping assembly 108 can include inspection holes 904. Each inspection hole 904 denotes an open area through the faceplate 210. Personnel can view the location of a pin 408 in a spring assembly 214a-214b by looking through an inspection hole 904. As noted above, the top pin 408 in a spring assembly 214a-214b could extend outside the housing 402 of that spring assembly 214a-214b. By viewing the location of the top pin 408 through an inspection hole 904, personnel can quickly determine whether the spring 404 in each spring assembly 214a-214b is in a properly loaded position.

In some embodiments, a spring 404 might need to be compressed to near solid height in order to prevent the shoulder bolts 216 from riding up the cam slots 220 during a shock or vibration event. One or more markings 906 could be provided on the housing 402 of each spring assembly 214a-214b to identify the desired position of the top pin 408. When the top pin 408 is at that location, the spring 404 of the spring assembly 214a-214b may have obtained the desired level of compression.

Note that the form and location of each inspection hole 904 in a faceplate 210 are for illustration only. An inspection hole 904 could have any other suitable size and shape, and the inspection hole 904 could be positioned at any suitable location of the faceplate 210. Also, each faceplate 210 could include any number of inspection holes 904.

In addition, note that the use of a pin 408 extending outside the housing 402 as a load indicator for a spring 404 is one example approach that could be used here, although other approached could also be used. For example, the spring nut 406 itself could be visible through an opening of the housing 402, or a projection from the spring nut 406 itself could extend outside the housing 402.

Although FIGS. 4A through 9C illustrate example features of the clamping assembly 108, various changes may be made to FIGS. 4A through 9C. For example, the sizes, shapes, and relative dimensions of the various components in the clamping assemblies 108 are for illustration only and can be modified as needed or desired. Also, any features shown in one or more of these figures could be used in the other figures, and any combination of these features could be used in a clamping assembly 108. In addition, various directional terms (such as top, bottom, side, horizontal, and vertical) are used above for convenience only and are made with reference to the particular orientations shown in FIGS. 4A through 9C. However, this does not limit how the clamping assemblies 108 can be used, and the clamping assemblies 108 could be used in any suitable orientations.

Figure 10:
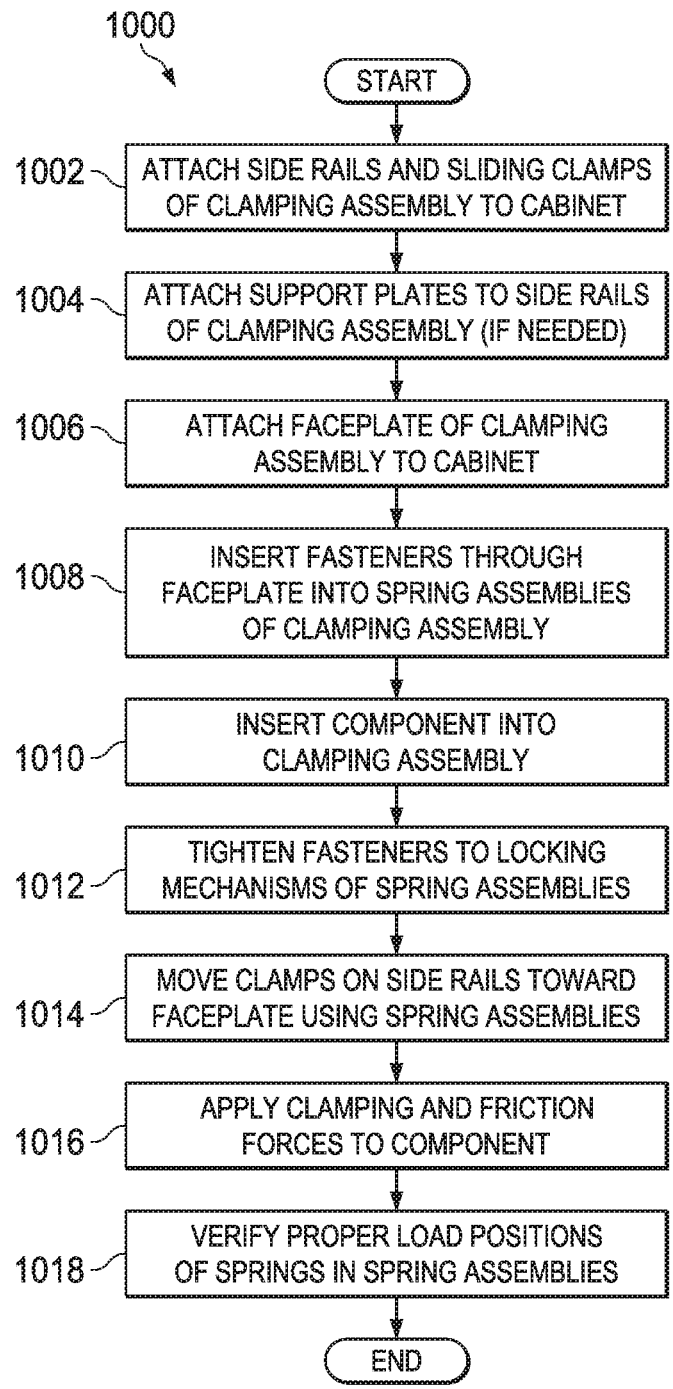
FIG. 10 illustrates an example method for mounting electronic equipment using a clamping assembly according to this disclosure.

FIG. 10 illustrates an example method 1000 for mounting electronic equipment using a clamping assembly according to this disclosure. For ease of explanation, the method 1000 is described with respect to the clamping assembly 108 of FIGS. 2 and 3 being used in the system 100 of FIG. 1. However, the method 1000 could be used with any other suitable clamping assemblies and in any other suitable system.

As shown in FIG. 10, side rails and sliding clamps of a clamping assembly are attached to a cabinet at step 1002. This could include, for example, attaching the side rails 202a-202b to a cabinet 102, such as by inserting bolts or other connectors through the holes of the rails 104 and into the holes 222 of the side rails 202a-202b to hold the side rails 202a-202b on the cabinet 102. Note that the clamps 204a-204b could be mounted on the side rails 202a-202b when the side rails are attached to the cabinet, or the clamps 204a-204b could be mounted on the side rails 202a-202b after the side rails have been attached to the cabinet.

One or more support plates are attached to the side rails of the clamping assembly if needed at step 1004. This could include, for example, attaching one or more plates 206 to the side rails 202a-202b. In particular embodiments, this could include placing extensions 804 of each plate 206 on or under the flanges 203 of the side rails 202a-202b or on or under horizontal portions of the clamps 204a-204b. The spring clips 802 can then be used to hold each plate 206 on the flanges 203 or clamps 204a-204b.

A faceplate of the clamping assembly is attached to the cabinet at step 1006. This could include, for example, attaching the faceplate 210 to the cabinet 102, such as by inserting bolts or other connectors through the faceplate 210 and into various holes of certain rails 104 of the cabinet 102. Fasteners are inserted through the faceplate of the clamping assembly into spring assemblies at step 1008. This could include, for example, inserting the fasteners 212 through holes of the faceplate 210 into the housings 402 of the spring assemblies 214a-214b. This could also include passing ends of the fasteners 212 through the springs 404 of the spring assemblies 214a-214b and loosely securing the fasteners 212 to the spring nuts 406 of the spring assemblies 214a-214b.

A component is inserted into the clamping assembly at step 1010. This could include, for example, personnel sliding electronic equipment 106 through the faceplate 210 and between the side rails 202a-202b of the clamping assembly 108. This could also include the personnel positioning the electronic equipment 106 so that the electronic equipment 106 sits on the flanges 203 of the side rails 202a-202b.

The fasteners are tightened to locking mechanisms of the spring assemblies at step 1012. This could include, for example, tightening the fasteners 212 into the spring nuts 406 of the spring assemblies 214a-214b to a desired degree. As a particular example, this could include tightening the fasteners 212 into the spring nuts 406 of the spring assemblies 214a-214b until the springs 404 of the spring assemblies 214a-214b obtain a desired level of loading.

As the fasteners are tightened to the locking mechanisms of the spring assemblies, the clamps on the side rails are moved toward the faceplate using the spring assemblies at step 1014, which applies clamping and friction forces to the component at step 1016. This could include, for example, the springs 404 of the spring assemblies 214a-214b pushing on the spring nuts 406. Since the spring nuts 406 are securely attached to the fasteners 212 and heads of the fasteners 212 are on the opposite side of the faceplate 210, the forces from the springs 404 cause the clamps 204a-204b that are attached to the fasteners 212 to move towards the faceplate 210. Clamping forces are created by the spring assemblies 214a-214b pulling the clamps 204a-204b towards the faceplate 210 and the clamps 204a-204b moving downward along the cam slots 220. Frictional forces are created by the clamps 204a-204b pushing the equipment 106 into the high-friction material 504, possibly in conjunction with friction tape on the equipment 106.

Proper load positions of the springs in the spring assemblies can be verified at step 1018. This could include, for example, personnel looking through inspection holes 904 to view the positions of the top pins 408 extending out of the housings 402 of the spring assemblies 214a-214b. Markings 906 could be used to identify desired positions of the top pins 408.

Although FIG. 10 illustrates one example of a method 1000 for mounting electronic equipment using a clamping assembly, various changes may be made to FIG. 10. For example, while shown as a series of steps, various steps in FIG. 10 could overlap, occur in parallel, occur in a different order, or occur any number of times. As another example, steps 1012-1016 generally overlap with one another since the tightening of the fasteners on the locking mechanisms moves the clamps to create the clamping and friction forces.

Note that the clamping assemblies 108 are often described above as being used to mount electronic equipment 106 in or to a cabinet 102. However, the clamping assemblies 108 described in this patent document could generally be used to secure any suitable components to any suitable support structures.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims is intended to invoke 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the scope of this disclosure, as defined by the following claims.

What is claimed is:

1. An apparatus comprising:
a clamping assembly configured to receive and secure a component in a support structure, the clamping assembly comprising:
a faceplate configured to be coupled to the support structure in a fixed position relative to the support structure;
first and second side rails configured to be coupled to the support structure in a fixed position relative to the support structure, the first and second side rails configured to apply frictional forces to the component, each of the first and second side rails having a plurality of cam slots;
first and second clamps slidably mounted to the first and second side rails respectively, wherein an extent of possible movement of each clamp relative to the corresponding side rail is constrained by boundaries of the cam slots; and
first and second spring assemblies configured to be coupled to the faceplate, the spring assemblies also configured to pull the first and second clamps toward the faceplate in order to apply clamping forces to the component.

2. The apparatus of claim 1, wherein:
each spring assembly comprises a housing containing a spring and a spring nut; and
the spring assemblies are configured to receive fasteners inserted through the faceplate and into the spring assemblies, the spring nuts of the spring assemblies configured to be coupled to the fasteners.

3. The apparatus of claim 2, wherein each spring assembly further comprises at least one pin configured to contain the spring in that spring assembly and to prevent rotation of the spring nut in that spring assembly.

4. The apparatus of claim 2, wherein, in each spring assembly, a pin connected to the spring nut or a portion of the spring nut extends outside the housing of that spring assembly in order to provide an indication of loading on the spring of that spring assembly.

5. The apparatus of claim 1, wherein the clamping assembly further comprises:
a first low-friction material located between the side rails and the clamps; and
a second low-friction material located along the cam slots in the side rails.

6. The apparatus of claim 1, wherein the clamping assembly further comprises:
a high-friction material located along flanges of the side rails.

7. The apparatus of claim 1, wherein the clamping assembly further comprises:
one or more removable plates configured to be positioned between the side rails and to provide support for the component.

8. The apparatus of claim 1, wherein the faceplate comprises at least one opening that allows inspection of the spring assemblies of the clamping assembly or inspection of other spring assemblies of another clamping assembly.

9. The apparatus of claim 1, wherein:
the first and second side rails are configured to apply the frictional forces to a first side of the component, and
the clamps are configured to apply clamping forces to a second side of the component, the second side of the component opposite to the first side of the component.

10. A system comprising:
a cabinet configured to receive and hold multiple pieces of electronic equipment; and
at least one clamping assembly configured to be coupled to the cabinet, each clamping assembly configured to receive and secure at least one of the pieces of electronic equipment, each clamping assembly comprising:
a faceplate configured to be coupled to the cabinet in a fixed position relative to the cabinet;
first and second side rails configured to be coupled to the cabinet in a fixed position relative to the cabinet, the first and second side rails configured to apply frictional forces to the at least one piece of electronic equipment, each of the first and second side rails having a plurality of cam slots;
first and second clamps slidably mounted to the first and second side rails respectively, wherein an extent of possible movement of each clamp relative to the corresponding side rail is constrained by boundaries of the cam slots; and
first and second spring assemblies configured to be coupled to the faceplate, the spring assemblies also configured to pull the first and second clamps toward the faceplate in order to apply clamping forces to the at least one piece of electronic equipment.

11. The system of claim 10, wherein, in each clamping assembly:
each spring assembly comprises a housing containing a spring and a spring nut; and
the spring assemblies are configured to receive fasteners inserted through the faceplate and into the spring assemblies, the spring nuts of the spring assemblies configured to be coupled to the fasteners.

12. The system of claim 11, wherein each spring assembly further comprises at least one pin configured to contain the spring in that spring assembly and to prevent rotation of the spring nut in that spring assembly.

13. The system of claim 11, wherein, in each spring assembly, a pin connected to the spring nut or a portion of the spring nut extends outside the housing of that spring assembly in order to provide an indication of loading on the spring of that spring assembly.

14. The system of claim 10, wherein each clamping assembly further comprises:
  a first low-friction material located between the side rails and the clamps; and
  a second low-friction material located along the cam slots in the side rails.

15. The system of claim 10, wherein each clamping assembly further comprises:
  a high-friction material located along flanges of the side rails.

16. The system of claim 10, wherein each clamping assembly further comprises:
  one or more removable plates configured to be positioned between the side rails and to provide support for the at least one piece of electronic equipment.

17. The system of claim 10, wherein the faceplate of each clamping assembly comprises at least one opening that allows inspection of the spring assemblies of that clamping assembly or inspection of other spring assemblies of another clamping assembly.

18. A method comprising:
  coupling a faceplate and first and second side rails of a clamping assembly to fixed positions on a support structure, wherein each of the first and second side rails comprises a plurality of cam slots;
  slidably mounting first and second clamps to the first and second side rails respectively, wherein an extent of possible movement of each clamp relative to the corresponding side rail is constrained by boundaries of the cam slots;
  coupling fasteners through the faceplate to first and second spring assemblies of the clamping assembly;
  using the spring assemblies to pull the first and second clamps toward the faceplate in order to apply clamping forces to a component mounted in the support structure; and
  using high-friction surfaces of the side rails to create frictional forces that contain the component during a shock or vibration event.

19. The method of claim 18, wherein:
  each spring assembly comprises a housing containing a spring and a spring nut; and
  the fasteners are inserted through the faceplate and into the spring assemblies and are coupled to the spring nuts of the spring assemblies.

20. The method of claim 19, wherein each spring assembly further comprises at least one pin that contains the spring in that spring assembly and prevents rotation of the spring nut of that spring assembly.

21. The method of claim 18, wherein:
  a first low-friction material is located between the side rails and the clamps and a second low-friction material is located along the cam slots in the side rails; and
  a high-friction material is located along flanges of the side rails.

* * * * *